(12) United States Patent
Delcol et al.

(10) Patent No.: US 7,859,327 B2
(45) Date of Patent: Dec. 28, 2010

(54) DEVICE FOR FILTERING A SIGNAL AND CORRESPONDING METHOD

(75) Inventors: Jean-Pierre Delcol, Tournefeuille (FR); Angelo Pasqualetto, Toulouse (FR)

(73) Assignee: Continental Automotive France, Toulouse (FR)

( * ) Notice: Subject to any disclaimer, the term of this patent is extended or adjusted under 35 U.S.C. 154(b) by 460 days.

(21) Appl. No.: 11/995,541

(22) PCT Filed: Jul. 7, 2006

(86) PCT No.: PCT/EP2006/006662

§ 371 (c)(1),
(2), (4) Date: Mar. 31, 2008

(87) PCT Pub. No.: WO2007/006500

PCT Pub. Date: Jan. 18, 2007

(65) Prior Publication Data

US 2008/0197917 A1    Aug. 21, 2008

(30) Foreign Application Priority Data

Jul. 13, 2005    (FR) .................................. 05 07522

(51) Int. Cl.
*H04B 1/10* (2006.01)

(52) U.S. Cl. ...................................... 327/551

(58) Field of Classification Search .................. 327/551, 327/552, 553
See application file for complete search history.

(56) References Cited

U.S. PATENT DOCUMENTS

| 4,349,754 | A | 9/1982 | Bull et al. |
| 6,940,340 | B2 * | 9/2005 | Liu .............................. 327/551 |
| 7,772,921 | B2 * | 8/2010 | Hung et al. .................. 327/551 |

FOREIGN PATENT DOCUMENTS

| EP | 0 392 182 A2 | 10/1990 |
| EP | 1 361 444 A2 | 11/2003 |
| JP | 60-225067 | 11/1985 |

\* cited by examiner

*Primary Examiner*—Hai L Nguyen
(74) *Attorney, Agent, or Firm*—Young & Thompson

(57) ABSTRACT

A device for filtering a signal delivered as output from a sensor installed in a motor vehicle includes a comparator (A) offering as output a first logic signal ($S_A$) representative of the positive and negative transitions of the output signal ($S_M$) from the sensor, a clock (G) delivering a signal ($S_G$) serving as time base for the whole device, elements (E, D, F) making it possible to fix a filtering time ($T_{Filt}$) of the output signal ($S_M$) from the sensor, a suppression block (B) receiving as input the first logic signal ($S_A$) and delivering as output a second logic signal ($S_b$) whose duration of holding (tn) in a logic state depends on the filtering time ($T_{Filt}$), and a control block (C) managing the set of the signals of the device, and having as input signals the first and second logic signals ($S_A$, $S_b$).

11 Claims, 2 Drawing Sheets

DEVICE FOR FILTERING A SIGNAL AND CORRESPONDING METHOD

Figure 1:
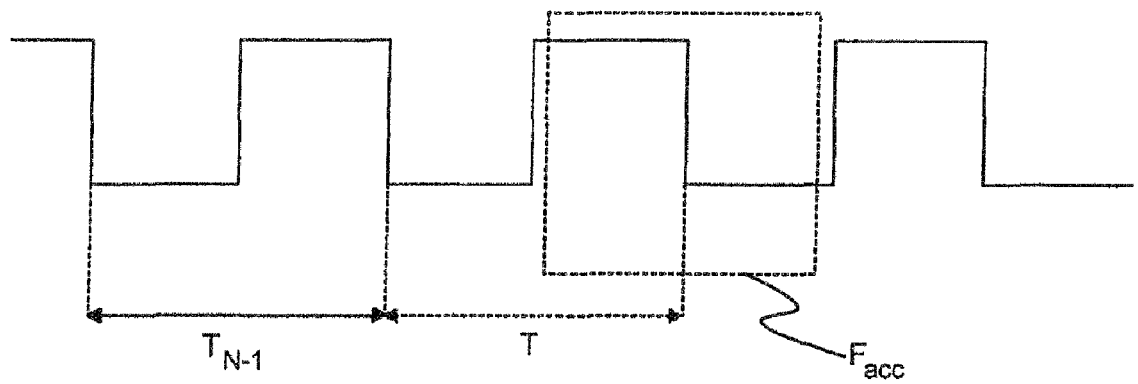

The present invention relates to signal processing and applies in particular, but not exclusively, to the processing of a signal arising from an electromagnetic sensor installed on a motor vehicle and associated with an electronic control unit, also called an E.C.U. by the person skilled in the art. It is known to use on a motor vehicle an electromagnetic sensor associated with a toothed wheel and producing an analog signal which is basically representative of the rotation of this toothed wheel.

More precisely, the alternation of the teeth of the toothed wheel generates a periodic signal of sinusoidal form, whose frequency increases with that of the rotation of the wheel. The passage of the sensor from a tooth of the toothed wheel to a trough brings about a positive or negative transition of the signal arising from the sensor. However, it may happen that the signal arising from the sensor is disturbed by electrical noise. It is then difficult to know whether the positive or negative transition is generated by the passage from a tooth to a trough of the toothed wheel or whether it is due to electrical noise, especially when the signal arising from the sensor is of low amplitude, for example during the synchronization step on startup or when the wheel is rotating at low speed.

It is then necessary to process the analog signal arising from the sensor so as to eliminate the spurious signal, generating a logic signal representative of the analog signal arising from the sensor but devoid of electrical disturbances.

The E.C.U. being furnished in general with a microcontroller, the conventional solution known to the person skilled in the art consists in using the calculation capability of the E.C.U. by effecting a software filter applied to the analog signal arising from the sensor. Thus, and referring to FIG. 1, at each significant edge, the microprocessor determines the time $T_{N-1}$ elapsed since the previous significant edge. From this it deduces the forecast time T of the next occurrence of the significant edge.

The expression "significant edges" is understood to mean two falling edges or else two rising edges. Specifically, for computer load reasons, the E.C.U. cannot perform the calculations whenever an edge is detected.

The time value T makes it possible to center an acceptance window $F_{acc}$ on the expected instant of the detection of the next significant edge. Outside of this acceptance window $F_{acc}$, the detected signal is ignored, that is to say no significant edge is taken into account, doing so in order to circumvent spurious glitches.

With a view to guaranteeing proper processing of the signal, the acceptance window $F_{acc}$ must be sufficiently restricted or at the very least be a fraction of T. If such is not the case, then the filtering is very bad, or indeed nonexistent.

Furthermore, the principle of operating with an acceptance window $F_{acc}$ precludes, unless once again said window is magnified with the attendant risk of no longer having an effective filter as mentioned above, waiting for the next significant edge if the latter does not occur in the time interval of said acceptance window $F_{acc}$.

The aim of the present invention is to remedy these drawbacks, and in particular to propose a filtering device operating independently of the E.C.U.

According to a first aspect, the invention relates to a device for filtering a signal representative of a phenomenon of determined instantaneous period, delivered as output by at least one sensor installed in a motor vehicle, characterized in that it comprises:

- a comparator A offering as output a first logic signal $S_A$ representative of the positive and negative transitions of the output signal $S_M$ from the sensor,
- a clock G delivering a signal $S_G$ serving as time base for the whole device,
- means E, D, F making it possible to fix a filtering time $T_{Filt}$ of said output signal $S_M$ from the sensor,
- a suppression block B receiving as input said first logic signal $S_A$ and delivering as output a second logic signal $S_B$ whose duration of holding tn in a logic state depends at least on said filtering time $T_{Filt}$, and
- a control block C managing at least the set of the signals of the device, and having as input signals at least said first and second logic signals $S_A$, $S_B$.

In a possible embodiment of the invention, the means E, D, F comprise:

- a counter F whose counting is triggered by said control block C when said second logic signal $S_B$ changes state, said counting not exceeding a maximum value $t_{dmax}$, said counter F being reinitialized by said control block C when said maximum value $t_{dmax}$ is reached or when said second logic signal $S_B$ changes state,
- a register E storing a fraction of the value contained in the counter F on receipt of a storage command signal Str emanating from the control block C, said storage command signal Str being dispatched when at least one change of state is detected on said first logic signal $S_A$ during said filtering time $T_{Filt}$, and
- a down counter D containing the value stored in said register E and of which a first countdown is triggered by said control block C when at least one change of state is detected on said second logic signal $S_B$.

Advantageously, the suppression block B operates selectively in "transparent" mode, said second logic signal $S_A$ then being identical to said input signal $S_A$, or in guard mode, said second logic signal $S_B$ then remaining unchanged irrespective of said first logic signal $S_A$. In this case, the suppression block B initially adopts said "transparent" mode, passes to guard mode after a first transition of said first logic signal $S_A$, and thereafter adopts said "transparent" mode or said guard mode depending on whether or not said down counter D has reached the value zero.

Preferably, the value stored in said register E is forced to a minimum value $t_{dmin}$ when the value arising from said counter F is less than $t_{dmin}$.

The counter F can be triggered when said second logic signal $S_B$ changes state.

In another possible embodiment of the invention, the down counter D is reloaded with the value contained in the register E when said first logic signal $S_A$ changes state and so long as said first countdown has not reached the value zero, a new countdown by said down counter D being triggered thereafter by said control block C.

Advantageously, the control block C is designed to reload the down counter D only a predefined number of times during said filtering time $T_{Filt}$.

The invention also relates to a method of filtering a signal $S_M$ representative of a phenomenon of determined instantaneous period, delivered as output by at least one sensor installed in a motor vehicle, consisting at least in:

- detecting a first positive or negative transition of the output signal $S_M$ of the sensor;
- converting the first positive or negative transition into a first logic signal $S_A$;
- creating a second logic signal $S_B$ having the same logic state as the first logic signal $S_A$ and holding the second logic signal $S_B$ in this same logic state;

storing in a register E a fraction of a value contained in a counter F if the fraction of the value is not equal to zero;

storing in the register E a predefined minimum value $t_{dmin}$ if the fraction of the value is less than the minimum value $t_{dmin}$;

initializing a down counter D with the value stored in the register E;

triggering the down counter D;

triggering the counter F, the counting being unable to exceed a predefined maximum value $t_{dmax}$;

reloading the down counter D with the value stored in the register E if the countdown has riot reached the value zero and if a new positive or negative transition of the signal $S_M$ is detected, the number of reloadings of the down counter D not exceeding a predefined integer number; and placing the second logic signal $S_B$ in the same logic state as the first logic signal $S_A$ if the down counter D has reached the value 0.

Figure 2:
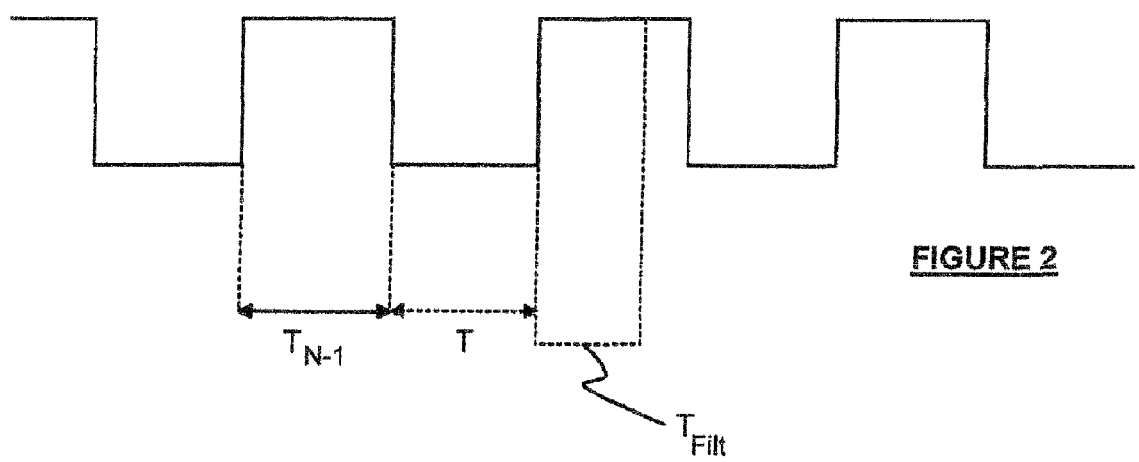
Figure 3:
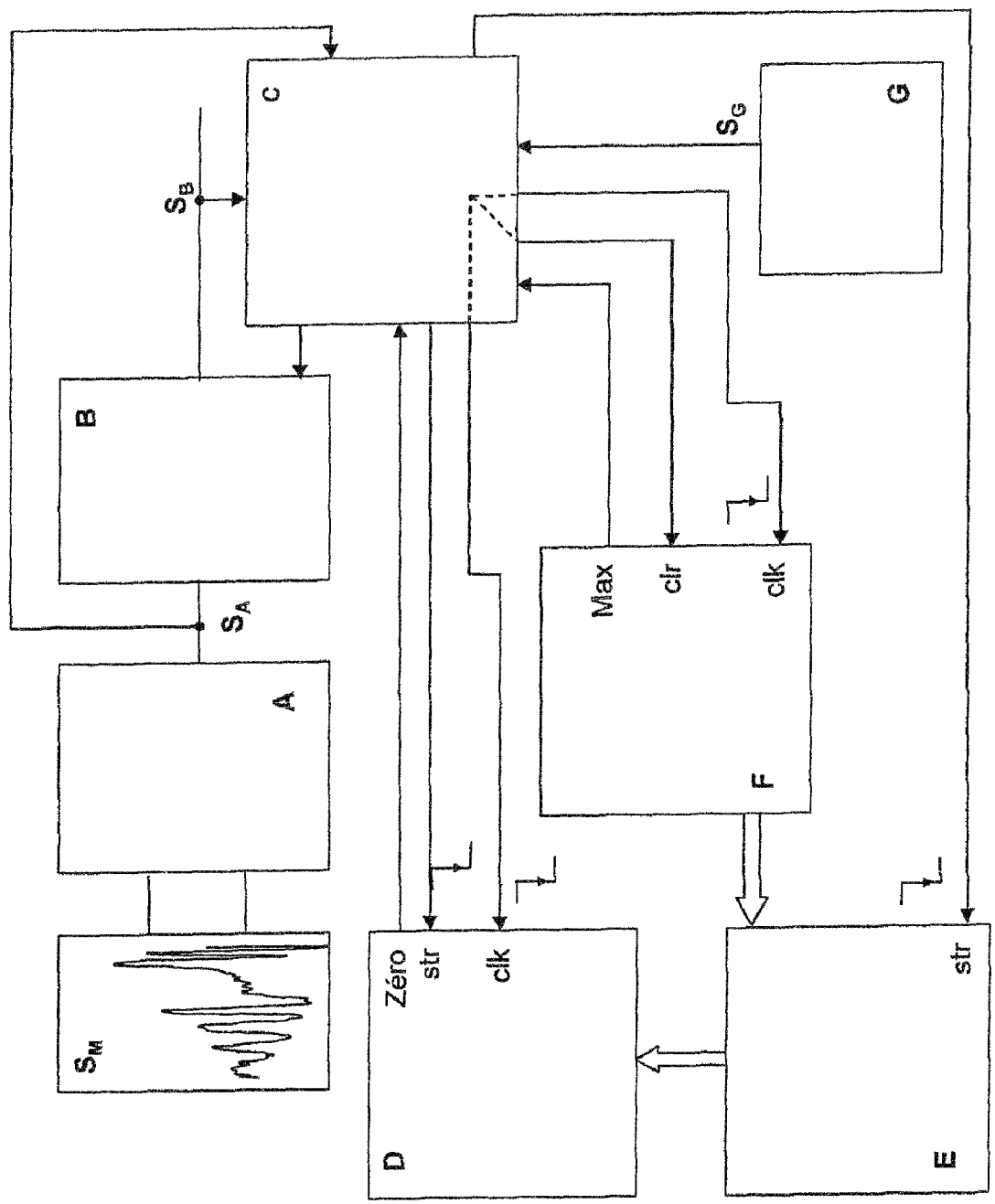

The invention and the advantages which stem therefrom will be more clearly apparent on reading the description which follows of a preferred embodiment, given purely by way of non-limiting example with reference to the appended drawings, in which:

FIG. 1 represents the basic operating diagram of a device in accordance with the prior art, FIG. 2 represents the basic operating diagram of a device in accordance with the invention, and FIG. 3 represents a diagram of the device according to the invention.

FIG. 3 presents a diagram of the device according to the invention which comprises a comparator A, a clock G, means E, D, F, a suppression block B and a control block C.

The comparator A receives on its differential input the signal $S_M$ output by the sensor, and delivers on its output a first logic signal $S_A$ representative of the positive and negative transitions of the signal $S_M$ output by the sensor. The logic signal $S_A$ may therefore still contain spurious signals.

The clock G delivers a signal $S_G$ which serves as time base for the whole device.

The means E, D, F make it possible to fix the filtering time $t_{vosdi}$ $T_{Filt}$ of the output signal $S_M$ from the sensor.

The suppression block B receives as input the first logic signal $S_A$ and delivers as output the second logic signal $S_B$ whose duration of holding tn in a logic state depends at least on the filtering time $T_{Filt}t_{vosdi}$. The suppression block B operates selectively in "transparent" mode, in which case the second logic signal $S_B$ is then identical to the input signal $S_A$, or in guard mode, in which case the second logic signal $S_B$ remains unchanged irrespective of the first logic signal $S_A$.

The control block C manages the set of the signals of the device. From among its input signals it counts the first and second logic signals $S_A$, $S_B$, and contains an internal counter.

The means E, D, F comprise a counter F, a register E and a down counter D.

The counter F contains the holding duration tn for the second logic signal $S_B$. The counting is triggered when the second logic signal $S_B$ changes state, and cannot exceed a predetermined maximum value $t_{dmax}$. It is reinitialized when the maximum value $t_{dmax}$ is reached or when the second logic signal $S_B$ changes state again.

The register E stores a fraction of the value contained in the counter F on receipt of a storage command signal Str emanating from the control block C. The storage command signal Str is dispatched when a change of state is detected on the first logic signal $S_A$ during the filtering time $T_{Filt}t_{vosdi}$. However, the value contained in the register E is forced to a minimum value $t_{dmin}$ when the fraction of the value contained in the counter F is less than $t_{dmin}$ (the larger value out of $t_{dmin}$ and that contained in the counter F is always retained).

The down counter D counts down from the value stored in the register E. A first countdown is triggered by the control block C when a change of state is detected on the second logic signal $S_B$. When the countdown reaches the value 0, the suppression block passes to "transparent" mode. So long as the countdown has not reached the value 0, the suppression block remains in guard mode.

Thus, according to a preferred embodiment of the invention, the frequency of the clock G can for example be fixed at 196 kHz, the maximum value $t_{dmax}$ can for example be fixed at 2.1 ms represented by 256 pulses, the minimum value $t_{dmin}$, can for example be fixed at 8.2 µs, this value is effective if a clock synchronization at 196 kHz is carried out each time that F is set to zero represented by a pulse, and the value stored in the register E can for example be fixed at a 32nd of the value contained in the counter F. This fraction is achievable by transferring the binary value contained in the counter F into the register E except for the 5 least significant bits.

It is thereafter possible to fix at 16 the maximum number of successive reloadings of the down counter D with the value stored in the register E, before the countdown reaches the value 0. Thus the filtering time $T_{Filt}t_{vosdi}$, with i equal to n+1, does not exceed half ($16/32$) the duration of holding tn of the second logic signal $S_B$ in a given state.

In the case, for example, where initially the signal $S_M$ is zero and therefore does not exhibit any positive or negative transition, the first logic signal $S_A$ is set for example to the low state. The down counter D contains "1" on all the bits, the register E is forced to the minimum value $t_{dmin}$, the counter F contains "1" on all the bits, the suppression block B is in "transparent" mode, the second logic signal $S_B$ thus being identical to the first logic signal $S_A$, and therefore set to the low state.

Assuming for example that the signal $S_M$ thereafter exhibits a positive transition, the first logic signal $S_A$ changes state and therefore passes to the high state. The suppression block B, still being in "transparent" mode, places the second logic signal $S_B$ in the high state. The control block C, detecting the change of state of the second logic signal $S_B$, instructs the register E to store a 32nd of the value contained in the counter F. The register E is then forced to the maximum value out of $t_{dmin}$ and of that contained in the counter F, represented in our example by the binary value 1. Simultaneously, the control block C loads the down counter D with the value contained in the register E, triggers the down counter D, reinitializes the counter F to the value 0 and triggers the counter F.

Additionally, the down counter D no longer being at 0, the suppression block B passes to guard mode.

Moreover, the loading value of the down counter D being parametrized so as to be less than the maximum value $t_{dmax}$ that the counter F can reach, the countdown will be finished before the counter F turns off at the maximum value $t_{dmax}$, that is to say 256.

During the countdown, the control block C polls the first logic signal $S_A$ so as to detect a possible change of state.

If the down counter D reaches the value 0 without the first logic signal $S_A$ having changed state, then the suppression block B passes to "transparent" mode, the control block C then polls the second logic signal $S_B$ so as to detect a possible change of state, the counter F continues to count, stopping only when it has reached the maximum value $t_{dmax}$ or when it receives a reinitialization signal.

If, during the countdown, the control block C detects a change of state of the first logic signal $S_A$, then the control block C reloads the down counter D with the value contained in the register E and triggers the countdown again. Under this condition, the successive reloading, respectively the successive triggering, of the down counter D cannot exceed the predetermined maximum number, that is to say 16 (since in our example, the down counter D can only be respectively reloaded successively and triggered successively a maximum of 16 times). If this maximum number is reached, while the control block C again detects a change of state of the first logic signal $S_A$, the down counter D is not reloaded and therefore reaches the value 0, thus causing the suppression block B to pass to "transparent" mode.

This limit therefore prevents missing altogether a signal passing in a higher frequency, in the case for example of poor contact of the sensor.

The down counter D having reached the value 0, the suppression block passes to "transparent" mode, and the control block C again polls the second logic signal $S_B$.

The invention claimed is:

1. A device for filtering a signal representative of a phenomenon of determined instantaneous period, delivered as output by at least one sensor installed in a motor vehicle, characterized in that it comprises:
    a comparator (A) offering as output a first logic signal ($S_A$) representative of the positive and negative transitions of the output signal ($S_M$) from the sensor,
    a clock (G) delivering a signal ($S_G$) serving as time base for the whole device,
    means (E, D, F) making it possible to fix a filtering time ($T_{Filt}$) of said output signal ($S_M$) from the sensor and comprising:
    a counter (F) whose counting is triggered by said control block (C) when said second logic signal ($S_B$) changes state, said counting not exceeding a maximum value ($t_{dmax}$), said counter (F) being reinitialized by said control block (C) when said maximum value ($t_{dmax}$) is reached or when said second logic signal ($S_B$) changes state,
    a register (E) storing a fraction of the value contained in the counter (F) on receipt of a storage command signal (Str) emanating from the control block (C), said storage command signal (Str) being dispatched when at least one change of state is detected on said first logic signal ($S_A$) during said filtering time ($T_{Filt}$), and
    a down counter (D) containing the value stored in said register (E) and of which a first countdown is triggered by said control block (C) when at least one change of state is detected on said second logic signal ($S_b$),
    a suppression block (B) receiving as input said first logic signal ($S_A$) and delivering as output a second logic signal ($S_B$) whose duration of holding (tn) in a logic state depends at least on said filtering time ($T_{Filt}$), and
    a control block (C) managing at least the set of the signals of the device, and having as input signals at least said first and second logic signals ($S_A$, $S_B$).

2. The filtering device as claimed in claim 1, characterized in that said counter (F) is triggered when said second logic signal ($S_B$) changes state.

3. The filtering device as claimed in claim 1, characterized in that the value stored in said register (E) is forced to a minimum value ($t_{dmin}$) when the value arising from said counter (F) is less than $t_{dmin}$.

4. The filtering device as claimed in claim 1, characterized in that said down counter (D) is reloaded with the value contained in the register (E) when said first logic signal ($S_A$) changes state and so long as said first countdown has not reached the value zero, a new countdown by said down counter (D) being triggered thereafter by said control block (C).

5. The filtering device as claimed in claim 4, characterized in that the control block (C) is designed to reload the down counter (D) only a predefined number of times during said filtering time ($T_{Filt}$).

6. The filtering device as claimed in claim 1, characterized in that said suppression block (B) operates selectively in "transparent" mode, said second logic signal ($S_B$) then being identical to said input signal ($S_A$), or in guard mode, said second logic signal ($S_B$) then remaining unchanged irrespective of said first logic signal ($S_A$),
    and in that said suppression block (B) initially adopts said "transparent" mode, passes to guard mode after a first transition of said first logic signal ($S_A$), and thereafter adopts said "transparent" mode or said guard mode depending on whether or not said down counter (D) has reached the value zero.

7. The filtering device as claimed in claim 6, characterized in that said counter (F) is triggered when said second logic signal ($S_B$) changes state.

8. The filtering device as claimed in claim 6, characterized in that the value stored in said register (E) is forced to a minimum value ($t_{dmin}$) when the value arising from said counter (F) is less than $t_{dmin}$.

9. The filtering device as claimed in claim 6, characterized in that said down counter (D) is reloaded with the value contained in the register (E) when said first logic signal ($S_A$) changes state and so long as said first countdown has not reached the value zero, a new countdown by said down counter (D) being triggered thereafter by said control block (C).

10. The filtering device as claimed. in claim 9, characterized in that the control block (C) is designed to reload the down counter (D) only a predefined number of times during said filtering time ($T_{Filt}$).

11. A method for filtering a signal ($S_M$) representative of a phenomenon of determined instantaneous period, delivered as output by at least one sensor installed in a motor vehicle, consisting at least in
    detecting a first positive or negative transition of the output signal ($S_M$) from the sensor;
    converting the first positive or negative transition into a first logic signal ($S_A$);
    creating a second logic signal ($S_B$) having the same logic state as the first logic signal ($S_A$) and holding the second logic signal ($S_B$) in this same logic state;
    storing in a register (E) a fraction of a value contained in a counter (F) if the fraction of the value is not equal to zero;
    storing in the register (E) a predefined minimum value ($t_{dmin}$) if the fraction of the value is less than the minimum value $t_{dmin}$;
    initializing a down counter (D) with the value stored in the register (E);
    triggering the down counter (D);
    triggering the counter (F), the counting being unable to exceed a predefined maximum value ($t_{dmax}$);
    reloading the down counter (D) with the value stored in the register (E) if the countdown has not reached the value zero and if a new positive or negative transition of the signal ($S_M$) is detected, the number of reloadings of the down counter (D) not exceeding a predefined integer number; and
    placing the second logic signal ($S_B$) in the same logic state as the first logic signal ($S_A$) if the down counter (D) has reached the value 0.

* * * * *